US008614660B2

(12) United States Patent
Oh

(10) Patent No.: US 8,614,660 B2
(45) Date of Patent: Dec. 24, 2013

(54) ORGANIC ELECTROLUMINESCENT DISPLAY DEVICE AND DRIVING METHOD THEREOF

(75) Inventor: Du-Hwan Oh, Cheongju-si (KR)

(73) Assignee: LG Philips LCD Co., Ltd., Seoul (KR)

( * ) Notice: Subject to any disclaimer, the term of this patent is extended or adjusted under 35 U.S.C. 154(b) by 1219 days.

(21) Appl. No.: 11/290,918

(22) Filed: Nov. 30, 2005

(65) Prior Publication Data

US 2006/0202977 A1 Sep. 14, 2006

(30) Foreign Application Priority Data

Mar. 14, 2005 (KR) ........................ 10-2005-0020907

(51) Int. Cl.
*G09G 3/36* (2006.01)
*G11C 19/00* (2006.01)

(52) U.S. Cl.
USPC ................................ 345/100; 345/99; 377/64

(58) Field of Classification Search
USPC ..................... 345/76–83, 204–215, 690–699; 315/169.1–169.3; 377/54, 64–81
See application file for complete search history.

(56) References Cited

U.S. PATENT DOCUMENTS

| | | | | |
|---|---|---|---|---|
| 7,145,533 | B2 * | 12/2006 | Imamura | 345/81 |
| 2005/0008114 | A1 * | 1/2005 | Moon | 377/64 |
| 2005/0030264 | A1 * | 2/2005 | Tsuge et al. | 345/76 |
| 2005/0190169 | A1 * | 9/2005 | Tajima | 345/204 |
| 2006/0041805 | A1 * | 2/2006 | Song | 714/724 |

OTHER PUBLICATIONS

Masuyuki Ohta, etc., "A Novel Current Programmed Pixel for Active Matrix OLED Display", TMD., SID., 2003, pp. 108-110.

* cited by examiner

*Primary Examiner* — Kenneth Bukowski
(74) *Attorney, Agent, or Firm* — Brinks Hofer Gilson & Lione

(57) ABSTRACT

A method and apparatus for driving an organic electroluminescent display device includes sequentially outputting first and second prior gate signals to first and second pixels on first and second row lines, respectively; outputting a first post gate signal to the first pixel using the first and second prior gate signals to the first pixel; switching a switching device according to the first prior gate signal; and switching a driving device according to the first post gate signal.

16 Claims, 7 Drawing Sheets

ORGANIC ELECTROLUMINESCENT DISPLAY DEVICE AND DRIVING METHOD THEREOF

The present application claims the benefit of Korean Patent Application No. 2005-0020907, filed in Korea on Mar. 14, 2005, which is hereby incorporated by reference for all purposes as if fully set forth herein.

TECHNICAL FIELD

The present application relates to an electroluminescent display device and a method of driving an electroluminescent display (OELD) device.

BACKGROUND

Display devices have employed cathode-ray tubes (CRT) to display images. However, various types of flat panel displays, such as liquid crystal display (LCD) devices, plasma display panel (PDP) devices, field emission display (FED) devices, and electro-luminescent display (ELD) devices, are currently being developed as substitutes for the CRT. Among these various types of flat panel displays, LCD devices have advantages of thin profile and low power consumption, but have disadvantages of using a backlight unit because they are non-luminescent display devices. However, as organic electroluminescent display (OELD) devices are self-luminescent display devices, they are operated at low voltages and have a thin profile. Further, the OELD devices have advantages of fast response time, high brightness and wide viewing angles.

As illustrated in FIG. 1, a gate line GL is extended along a row line, and a data line DL is extended along a column line perpendicular to the row line, and the gate and data lines GL and GL define a pixel region P. In the pixel region P, first and second switching thin film transistors (TFT) T1 and T2, and first and second driving TFT T3 and T4 are formed. The first and second switching TFT T1 and T2 and the second driving TFT T4 use a PMOS TFT, and the first driving TFT T3 uses a NMOS TFT.

The first and second switching TFT T1 and T2 are connected in series. The source electrode of the first switching TFT T1 is connected to a first electrode of a storage capacitor Cst, and a drain electrode of the second switching TFT T2 is connected to the data line DL. A second electrode of the storage capacitor Cst is connected to a power supply line VDDL supplying a power voltage (VDD). The first and second driving TFT T3 and T4 are connected in series. A source electrode of the second driving TFT T4 is connected to the power supply line VDDL, and a gate electrode of the second driving TFT T4 is connected to the source electrode of the first switching TFT T1. A source electrode of the first driving TFT T3 is connected to a first electrode (anode) of an organic electroluminescent diode OED. The second electrode (cathode) of the OED is grounded.

Gate electrodes of the first and second switching TFT T1 and T2 and the first driving TFT T3 are connected to the gate line GL. The gate electrode of the second driving TFT T4 is connected to the source electrode of the first switching TFT T1.

FIG. 2A is a timing chart illustrating a gate signal and a current ($I_{SIG}$) of an OELD device of FIG. 1. FIG. 2B is a circuit diagram illustrating a pixel region, to which an "on" gate signal is applied, of an OELD device of FIG. 1; and, FIG. 2C is a circuit diagram illustrating a pixel region, to which an "off" gate signal is applied, of an OELD device of FIG. 1.

When an "on" (negative) gate signal is applied to the gate line GL during a first period a of one frame period, the first and second switching TFT T1 and T2 are turned on and the first driving TFT T3 is turned off, as shown in FIG. 2B. Accordingly, the second driving TFT T4 is turned on, and thus a current (ISIG) flows from the power supply line VDD to the data line DL through the second driving TFT T4. At this time, a data signal (Vdata) from the data line DL is applied to the gate electrode of the second driving TFT T4, and thus the second driving TFT T4 has a gate voltage Vg=VDD−Vth+Vdata, where Vth is a threshold voltage. The gate voltage Vg is stored in the storage capacitor Cst. Since the first driving TFT T3 is turned off during the first period, a, a current does not flow in the organic electroluminescent diode OED.

When an "off" (positive) gate signal is applied to the gate line GL during a second period, b, of one frame period, the first and second switching TFT T1 and T2 are turned off and the first driving TFT T3 is turned on, as shown in FIG. 2C. Since the first driving TFT T3 is turned on during the second period, b, a current (Ioeld) flows on the organic electroluminescent diode OED. An amount of the current (Ioeld) flowing on the organic electroluminescent diode OED is determined according to an amplitude of the gate voltage Vg stored in the storage capacitor Cst, and in particular the data signal (Vdata). In other words, the current (Ioeld) is expressed as $Ioeld=K(Vgs-|Vth|)^2=K(VDD-Vth+Vdata-VDD-|Vth|)^2=K(Vdata)^2$. The expression for current (Ioeld) flowing in the organic electroluminescent diode OED has no terms representing either the power voltage (VDD) and or the threshold voltage (Vth).

Therefore, the related art OELD device of FIG. 1 prevents degradation of display quality by compensation of the threshold voltage (Vth) and a drop of the power voltage (VDD). In addition, the related art OELD device of FIG. 1 increases the aperture ratio because it requires one gate line for one pixel. However, since the related art OELD device of FIG. 1 uses both PMOS and NMOS TFT on the same substrate, and the cost to fabricate both PMOS and NMOS TFT increases.

FIG. 3A is a circuit diagram of another type OELD device according to the related art, and FIG. 3B is a timing chart illustrating gate signals and a current ($I_{SIG}$) of an OELD device of FIG. 3A.

As shown in FIGS. 3A and 3B, the related art OELD device has prior and post gate lines GL1 and GL2 in a pixel region P. A data line (not shown) crosses the prior and post gate lines GL1 and GL2 to define the pixel region P. In the pixel region P, first and second switching thin film transistors (TFT) T1 and T2, and first and second driving TFT T3 and T4 are formed.

The first and second switching TFTs T1 and T2 and the first and second driving TFT T3 and T4 use PMOS TFT. In other words, the OELD device of FIG. 3A has the PMOS TFT as the first driving TFT T1, differing from the OELD device of FIG. 1. The first and second switching TFT T1 and T2 are connected to the prior gate line GL1 and turned on or off according to a prior gate signal, and the first driving TFT T3 is connected to the post gate line GL2 and turned on or off according to a post gate signal.

When an "on" (negative) prior gate signal is applied to the prior gate line GL1 during a first period, a, of one frame period, the data signal (Vdata) is applied to the gate electrode of the second driving TFT T4 and a current (ISIG) flows from the power supply line VDDL to the data line. When the "on" (negative) prior gate signal of the prior gate line GL1 is finished, an "on" (negative) post gate signal starts to be applied to the post gate line GL2 and the first driving TFT T3 is turned on. The "on" post gate signal is applied during a second period b of one frame period. Accordingly, a current (Ioeld) flows in an organic electroluminescent diode (OED).

The OELD device of FIG. 3A has the same operational characteristics as the OELD device of FIG. 1, and in addition, it uses the PMOS TFT as the switching and driving TFT. Accordingly, fabrication cost is reduced.

As explained above, the data signal (Vdata) is applied to the gate electrode of the second driving TFT T4 during the first period, a, and the current (Ioeld) flows during the second period, b, thus a display image for one frame is displayed. In other words, the display image is displayed during the second period, b, i.e., a period subtracting the first period a from one frame period, and to do this, an on gate signal is applied to the post gate line GL2 during the second period, b. However, since the post gate line GL2 is applied with an "on" gate signal during a long interval of the second period, b, distortion of signals is caused and the distortion of signals causes degradation of display quality. In addition, to prevent these problems, a separate external drive IC supplying an on gate voltage to the post gate line GL2 is required.

SUMMARY

A method and apparatus for driving an organic electroluminescent display device is disclosed, including sequentially outputting first and second prior gate signals to first and second pixels on first and second row lines, respectively; outputting a first post gate signal to the first pixel using the first and second prior gate signals to the first pixel; switching a switching device according to the first prior gate signal; and, switching a driving device according to the first post gate signal.

In another aspect, an organic electroluminescent display device includes first and second prior gate lines connected to first and second pixels on first and second row lines, respectively; a first post gate line connected to the first pixel; first and second prior shift register stages connected to the first and second prior gate lines, respectively; first post shift register stage connected to the first post gate line, the first post shift register stage supplied with gate signals of the first and second prior gate lines; a switching device in the first pixel connected to the first prior gate line; and, a driving device in the first pixel connected to the first post gate line.

In another aspect, an organic electroluminescent display device includes $1^{st}$ to $n^{th}$ prior gate lines connected to $1^{st}$ to $n^{th}$ pixels on first to $n^{th}$ row lines, respectively; $1^{st}$ to $n^{th}$ post gate lines connected to the first to $(n+1)^{th}$ pixels; an auxiliary line next to $n^{th}$ prior gate line; first to $n^{th}$ prior shift register stages connected to the $1^{st}$ to $n^{th}$ prior gate lines, respectively, and a $(n+1)^{th}$ prior shift register stage to connected to the auxiliary line; and $1^{st}$ to $n^{th}$ post shift register stages connected to the $\mathbf{1}^{st}$ to $n^{th}$ post gate lines, respectively, wherein a $m^{th}$ post shift register stage of the $\mathbf{1}^{st}$ to $n^{th}$ post shift register stages is connected to the $m^{th}$ and $(m+1)^{th}$ prior shift register stages.

DETAILED DESCRIPTION

Exemplary embodiments may be better understood with reference to the drawings, but these embodiments are not intended to be of a limiting nature. Like numbered elements in the same or different drawings perform equivalent functions.

Figure 1:
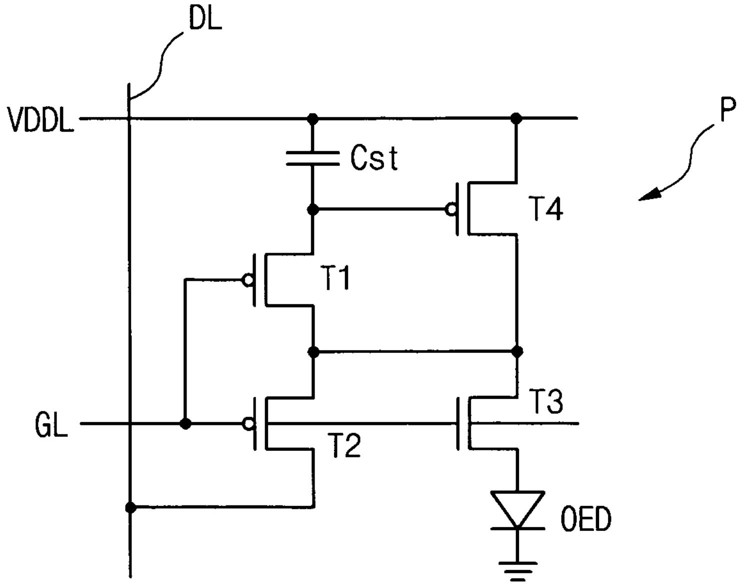
FIG. 1 RELATED ART
FIG. 1 is a circuit diagram illustrating an organic OELD device according to the related art.
Figure 2A:
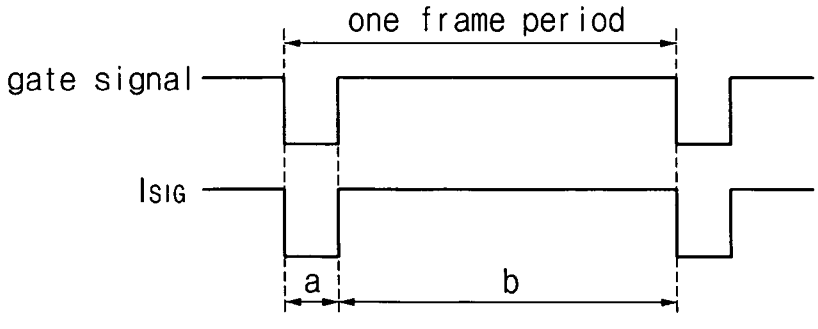
FIG. 2A RELATED ART
FIG. 2A is a timing chart illustrating a gate signal and a current ($I_{SIG}$) of an OELD device of FIG. 1.
Figure 2B:
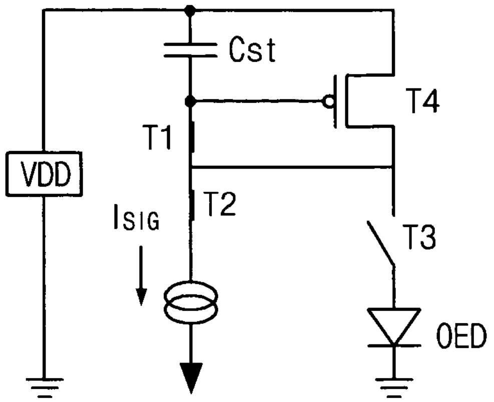
FIG. 2B RELATED ART
FIG. 2B is a circuit diagram illustrating a pixel region, which an "on" gate signal is applied to, of an OELD device of FIG. 1.
Figure 2C:
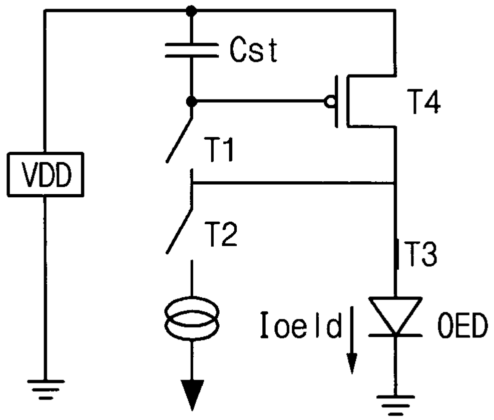
FIG. 2C RELATED ART
FIG. 2C is a circuit diagram illustrating a pixel region, which an "off" gate signal is applied to, of an OELD device of FIG. 1.
Figure 3A:
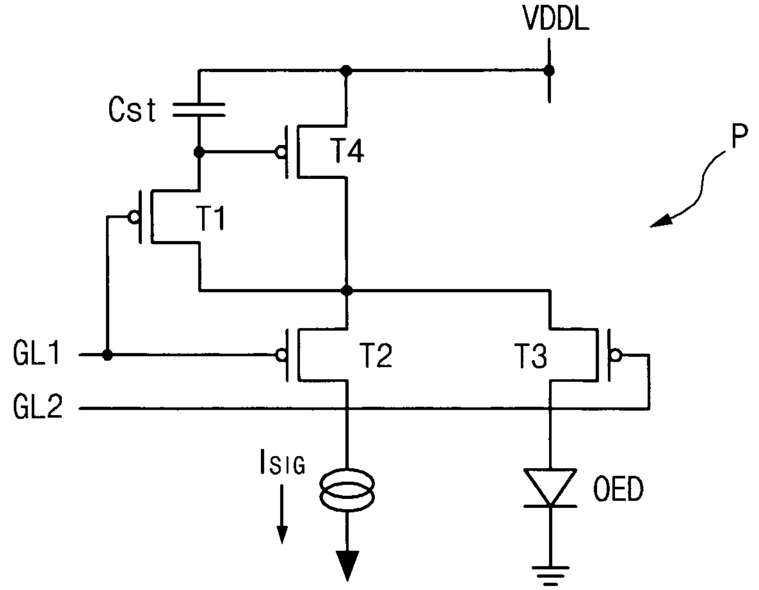
FIG. 3A RELATED ART
FIG. 3A is a circuit diagram of an another type OELD device according to the related art.
Figure 3B:
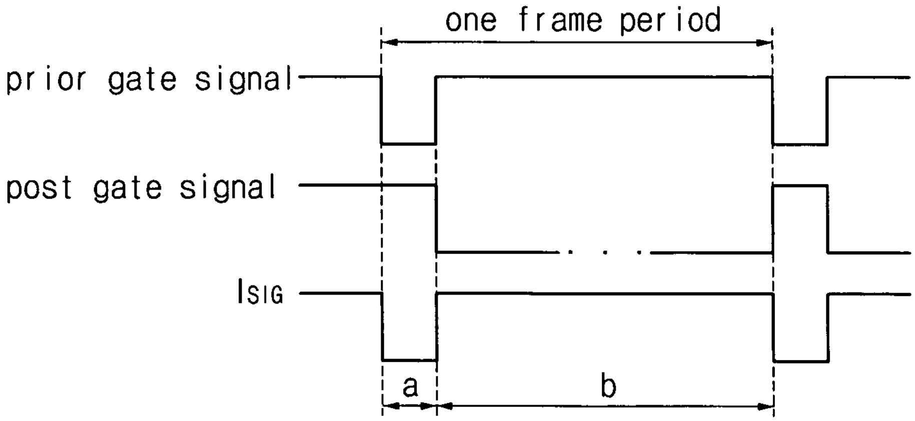
FIG. 3B RELATED ART
FIG. 3B is a timing chart illustrating gate signals and a current ($I_{SIG}$) of an OELD device of FIG. 3A.
Figure 4:
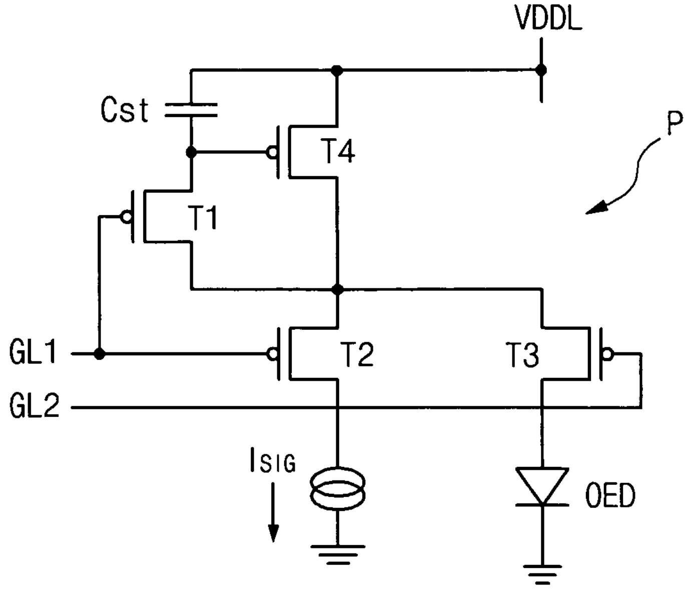
FIG. 4 is a circuit diagram illustrating an OELD device according to an first embodiment.

FIG. 4 shows an OELD device according to a first embodiment having prior and post gate lines GL1 and GL2 extended along a row line in a pixel region P. A data line (not shown) is extended along a column line crossing the prior and post gate lines GL1 and GL2 to define the pixel region P. In the pixel region P, first and second switching thin film transistors (TFT) T1 and T2, first and second driving TFT T3 and T4, a storage capacitor Cst and an organic electroluminescent diode OED are formed. The first and second switching TFT T1 and T2 and the first and second driving TFT T3 and T4 use PMOS TFT.

The first and second switching TFT T1 and T2 are connected in series. Gate electrodes of the first and second switching TFT T1 and T2 are connected to the prior gate line G1. A source electrode of the first switching TFT T1 is connected to a first electrode of the storage capacitor Cst. A drain electrode of the second switching TFT T2 is connected to the data line. A second electrode of the storage capacitor Cst is connected to a power supply line VDDL supplying a power voltage (driving voltage) (VDD). The first and second driving TFTs are connected in series. A gate electrode of the second driving TFT T4 is connected to the source electrode of the first switching TFT T1. A source electrode of the second driving TFT T4 is connected to the power supply line VDDL. A gate electrode of the first driving TFT T3 is connected to the post gate line G2. A drain electrode of the first driving TFT T3 is connected to a first electrode (anode) of the organic electroluminescent diode OED. A second electrode (cathode) of the organic electroluminescent diode OED is grounded. A connection point of the first and second switching TFT T1 and T2 is connected to a connection point of the first and second driving TFT T3 and T4.

The first and second switching TFT T1 and T2 are connected to the prior gate line GL1 and turned on or off according to an "on" or "off" (negative and positive, respectively) state of a prior gate signal, and the first driving TFT T3 is connected to the post gate line GL2 and turned on or off according to an "on" or "off" (negative and positive, respectively) state of a post gate signal.

When an "on" (negative) prior gate signal is applied to the prior gate line GL1, a data signal (Vdata) is applied to the gate electrode of the second driving TFT T4 and a current ($I_{SIG}$) flows from the power supply line VDDL to the data line through the second driving TFT T4. At this time, the gate voltage of the second driving TFT T4 including the data signal (Vdata) are stored in the storage capacitor Cst. The gate voltage of the second driving TFT T4 stored in the storage capacitor Cst determines an amount of a current (Ioeld) flowing in the organic electroluminescent diode (OED) when an "on" post gate signal is applied to the post gate line GL2. In other words, when the on post gate signal is applied to the post gate line GL2, the current (Ioeld) flows in the organic electroluminescent diode (OED). Accordingly, the organic electroluminescent diode (OED) emits light and a display image is displayed.

Figure 5A:
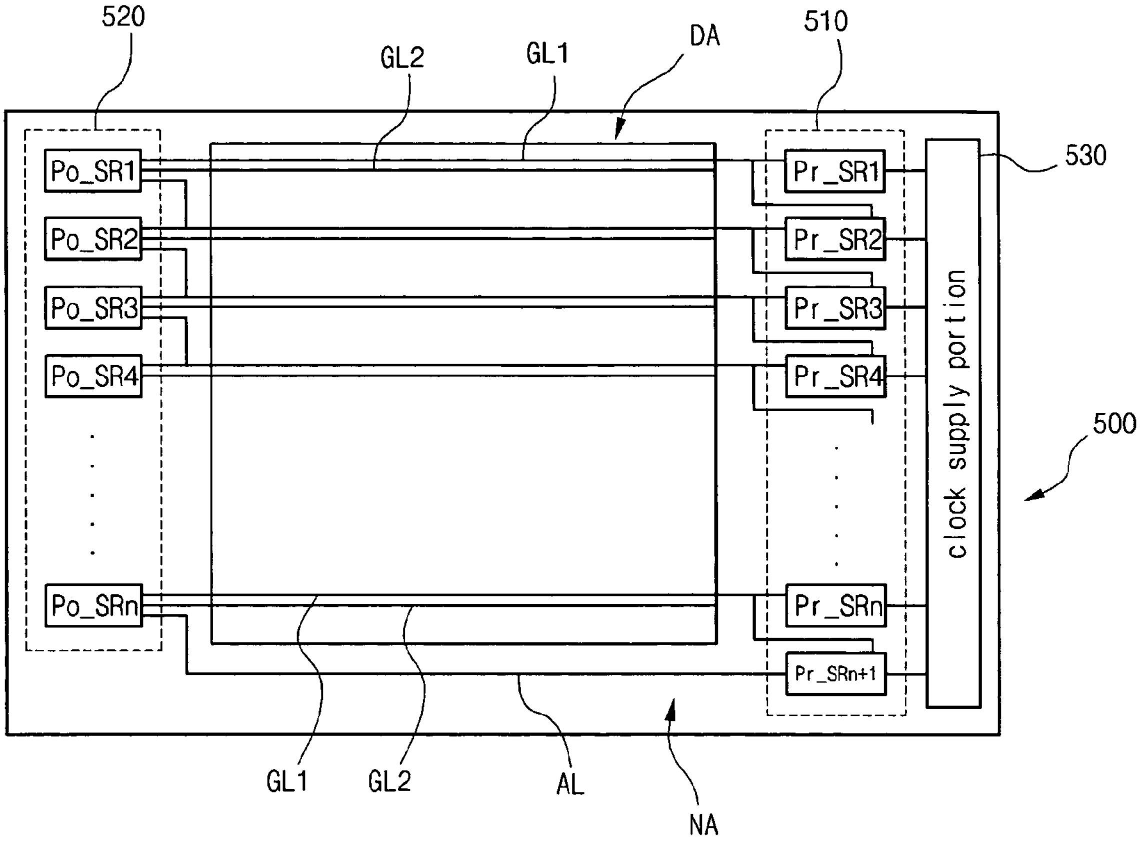
FIG. 5A is a schematic plan view illustrating an OELD device according to a first embodiment.
Figure 5B:
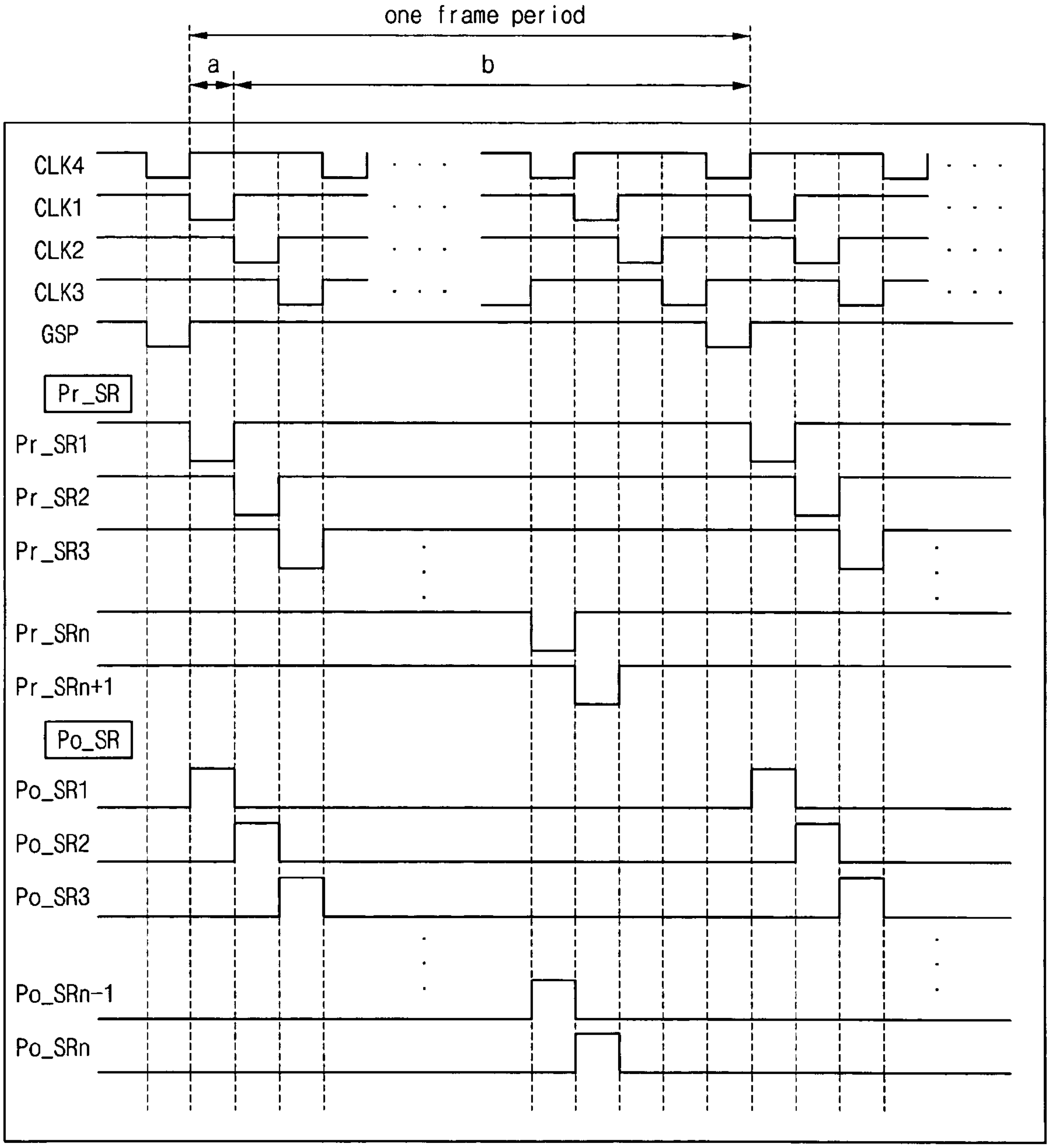
FIG. 5B is a timing chart illustrating $1^{st}$ to $4^{th}$ clock signals and prior and post gate signals of an OELD device of FIG. 5A.

FIG. 5A is a schematic plan view illustrating an OELD device according to a first embodiment, and FIG. 5B is a timing chart illustrating first to fourth clock signals and prior and post gate signals of an OELD device of FIG. 5A.

As illustrated in FIGS. 4 to 5B, an OELD device 500 includes a plurality of pixel regions P in a display area DA, and prior and post shift registers 510 and 520 and a clock supply portion 530. Although not shown in the drawings, the plurality of pixel regions P are arranged in a matrix form, and a number of row lines of the plurality of pixel regions P is n. In addition, a number of each of the prior and post gate lines GL1 and GL2 is n.

The prior shift register 510 sequentially outputs the prior gate signals, and the post shift register 520 sequentially outputs the post gate signals. The prior shift register 510 includes first to $(n+1)^{th}$ prior stages Pr_SR1, Pr_SR2, Pr_SR3, Pr_SR4, . . . , Pr_SRn and Pr_SRn+1. The post shift register 520 includes first to $n^{th}$ post stages Po_SR1, Po_SR2, Po_SR3, Po_SR4, . . . , and Po_SRn.

The first to $(n+1)^{th}$ prior stages Pr_SR1, Pr_SR2, Pr_SR3, Pr_SR4, . . . , Pr_SRn and Pr_SRn sequentially output the prior gate signals to the prior gate lines G1, however, the $(n+1)^{th}$ prior stage Pr_SRn+1 outputs the $(n+1)^{th}$ post gate signal to an auxiliary line AL. In other words, the $(n+1)^{th}$ prior stage Pr_SRn+1 is used as an auxiliary stage, and outputs the $(n+1)^{th}$ prior gate signal as an auxiliary signal to an auxiliary line AL. The first to $n^{th}$ post stages Po_SR1, Po_SR2, Po_SR3, Po_SR4, . . . , and Po_SRn sequentially output the post gate signals. Each prior gate signal has an "on" (negative) state during a first period a, and each post gate signal has an "on" (negative) state during a second period b. The first and second periods, a and b, constitutes one frame period (vertical period). In other words, on and off states of each of the prior and post gate signals alternate, and the prior and post gate signals of the same row line alternate.

The $m^{th}$ prior and post gate signals operate the pixel region P on an $m^{th}$ row line ($1 \leq m \leq n$). The $m^{th}$ post gate signal is output by using the $m^{th}$ and $(m+1)^{th}$ prior gate signals. For example, the first post stage Po-SR1 outputs the first post gate signal by using the first and second prior gate signals. Since the $m^{th}$ post stage Po-SRm uses the $m^{th}$ and $(m+1)^{th}$ prior gate signals, the prior shift register 510 has one more stage than the post shift register 520. The $m^{th}$ and $(m+1)^{th}$ prior gate signals are supplied to the $m^{th}$ post stage Po-SRm through the corresponding prior gate lines GL1.

The clock supply portion 530 generates and sequentially supplies first to fourth clocks CLK1 to CLK4 each sequentially having a negative (low) state during four first periods a. The negative state of each first to fourth clocks CLK1 to CLK4 exists during the first period a. The first to fourth clocks CLK1 to CLK4 are sequentially supplied to the prior shift register 510.

The prior stages Pr_SR1, Pr_SR2, Pr_SR3, Pr_SR4, . . . , Pr_SRn and Pr_SRn+1 output the prior gate signals by using the previous prior gate signal (or a gate start pulse GSP) and at least one of the first to fourth clocks CLK1 to CLK4. The previous prior gate signal (or a gate start pulse GSP) is used as a start signal. For example, the gate start pulse GSP, which is output from a gate driver, as the previous prior gate signal and at least one of the first to fourth clocks CLK1 to CLK4 are inputted to the first prior stage Pr-SR1. When the gate start pulse GSP has a negative (low) state, the first clock CLK1 is output as the first prior gate signal such that the first prior gate signal has a negative (low) state during the first period a. Then, substantially at an end of the first period a, the first clock CLK1 is not output and a signal having a positive (high) state is output as the first prior gate signal such that the first prior gate signal has a positive (high) state during the second period b. Similarly, negative (low) states of the second to fourth clocks CLK2 to CLK4 are output as the second to fourth prior gate signals, respectively, during the corresponding first period a. In this manner, the prior stages Pr_SR1, Pr_SR2, Pr_SR3, Pr_SR4, . . . , Pr_SRn and Pr_SRn+1 sequentially output the prior gate signals by repeatedly using negative states of the first to fourth clocks CLK1 to CLK4.

The first to fourth clocks CLK1 to CLK4 synchronize with the corresponding prior gate signals. Meanwhile, if a number of the prior gate lines GL1 does not correspond to a multiple of four, at least one of the second to fourth clocks CLK2 to CLK4 are disregarded. In other words, if the $(n+1)^{th}$ prior gate signal synchronizes with the second clock CLK2 in a frame period, the subsequent third and fourth clocks CLK3 and CLK4 are disregarded, and the first prior gate signal synchronizes with the first clock CLK1 in a next frame period.

The post gate signal is output by using the corresponding prior gate signal and the next prior gate signal. For example, the first post gate signal is output by using the first and second prior gate signals. In more detail, when the first prior gate signal has an "on" (negative) state, the first post gate signal has an "off" (positive) state during the first period a. Then, when an on (negative) state of the first prior gate signal is finished and the second prior gate signal has an "on" (negative) state, the first post gate signal has an "on" (negative) state during the second period b. In this manner, the first to $n^{th}$ post stages Po_SR1, Po_SR2, Po_SR3, Po_SR4, . . . , and Po_SRn sequentially output the post gate signals.

In the first embodiment, the first and second shift registers and the clock supply portion include a plurality of TFT, which can be directly formed in the OELD device by the same processes as the switching and driving TFT. Accordingly, the post gate signal can be stably applied to the driving TFT during a long interval without a separate drive IC. In addition, the PMOS TFT are used as the switching and driving TFT, and thus fabrication cost may be reduced.

However, it is possible that the post shift register may output an abnormal post gate signal according to properties of the TFT thereof. In other words, if the TFT of the post shift register has a low threshold voltage and mobility thereof increases, a leakage current is caused when the TFT of the shift register is turned off.

Figure 6:
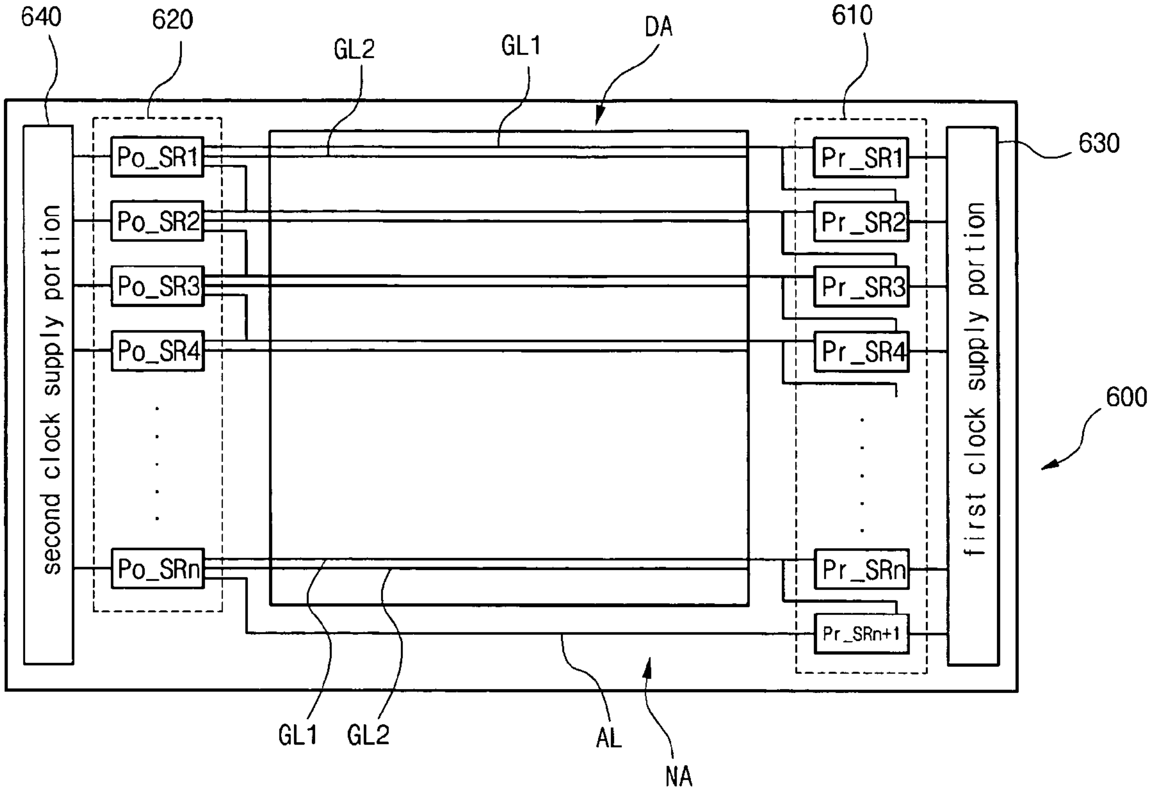
FIG. 6 is a schematic plan view illustrating an OELD device according to a second embodiment.

FIG. 6 is a schematic plan view illustrating an OELD device according to a second embodiment. The OELD device has a structure similar to a structure of the OELD device of the first embodiment, except for a second clock supply portion. Accordingly, explanations of parts similar to parts of the first embodiment will be omitted.

As illustrated in FIG. 6, the OELD device of the second embodiment includes the second clock supply portion 640. The first clock supply portion 630 corresponds to the clock supply portion (530 of FIG. 5A) of the first embodiment. In addition, the OELD device 600 includes a plurality of pixel regions (P of FIG. 4) in a display area DA, and prior and post shift registers 610 and 620 and a first clock supply portion 630. Although not shown in the drawings, the plurality of pixel regions are arranged in a matrix form, and a number of row lines of the plurality of pixel regions is n. In addition, a number of each of the prior and post gate lines GL1 and GL2 is n.

The prior shift register 610 sequentially outputs the prior gate signals, and the post shift register 620 sequentially outputs the post gate signals. The prior shift register 610 includes first to $(n+1)^{th}$ prior stages Pr_SR1, Pr_SR2, Pr_SR3, Pr_SR4, . . . , Pr_SRn and Pr_SRn+1. The post shift register 520 includes first to $n^{th}$ post stages Po_SR1, Po_SR2, Po_SR3, Po_SR4, . . . , and Po_SRn.

The first to $(n+1)^{th}$ prior stages Pr_SR1, Pr_SR2, Pr_SR3, Pr_SR4, . . . , Pr_SRn and Pr_SRn+1 sequentially output the prior gate signals, and in particular, the $(n+1)^{th}$ prior stage Pr_SRn+1 outputs the $(n+1)^{th}$ post gate signal to an auxiliary line AL not the prior gate line GL1. In other words, the $(n+1)^{th}$ prior stage Pr_SRn+1 is used as an auxiliary stage, and outputs the $(n+1)^{th}$ prior gate signal as an auxiliary signal to an auxiliary line AL. The first to $n^{th}$ post stages Po_SR1, Po_SR2, Po_SR3, Po_SR4, . . . , and Po_SRn sequentially output the post gate signals. Each prior gate signal has an "on" (negative) state during a first period (a of FIG. 5B), and each post gate signal has an "on" (negative) state during a second period (b of FIG. 5B). The first and second periods constitutes one frame period (vertical period). In other words, on and off states of each of the prior and post gate signals alternate, and the prior and post gate signals of the same row line alternate.

The $m^{th}$ prior and post gate signals operate the pixel region on an $m^{th}$ row line ($1 \leq m \leq n$). The $m^{th}$ post gate signal is output by using the $m^{th}$ and $(m+1)^{th}$ prior gate signals. For example, the first post stage Po-SR1 outputs the first post gate signal by using the first and second prior gate signals. Since the $m^{th}$ post stage Po-SRm uses the $m^{th}$ and $(m+1)^{th}$ prior gate signals, the prior shift register 510 has one more stage than the post shift register 620. The $m^{th}$ and $(m+1)^{th}$ prior gate signals are supplied to the mth post stage Po-SRm through the corresponding prior gate lines GL1.

The first clock supply portion 630 generates and sequentially supplies first to fourth clocks CLK1 to CLK4 sequentially having a negative (low) state during four first periods. The negative state of each first to fourth clocks CLK1 to CLK4 exists during the first period. The first to fourth clocks CLK1 to CLK4 are sequentially supplied to the prior shift register 610.

The prior stages Pr_SR1, Pr_SR2, Pr_SR3, Pr_SR4, . . . Pr_SRn and Pr_SRn+1 output the prior gate signals by using the previous prior gate signal (or a gate start pulse GSP) and at least one of the first to fourth clocks CLK1 to CLK4. For example, the gate start pulse (GSP of FIG. 5B), which is output from a gate driver, as the previous prior gate signal and at least one of the first to fourth clocks CLK1 to CLK4 are inputted to the first prior stage Pr-SR1. When the gate start pulse has a negative (low) state, the first clock CLK1 is output as the first prior gate signal such that the first prior gate signal has a negative (low) state during the first period. Then, substantially at an end of the first period, the first clock CLK1 is not output and a signal having a positive (high) state is output as the first prior gate signal such that the first prior gate signal has a positive (high) state during the second period. Similarly, negative (low) states of the second to fourth clocks CLK2 to CLK4 are output as the second to fourth prior gate signals, respectively, during the corresponding first period. In this manner, the prior stages Pr_SR1, Pr_SR2, Pr_SR3, Pr_SR4, . . . , Pr_SRn and Pr_SRn+1 sequentially output the prior gate signals by repeatedly using negative states of the first to fourth clocks CLK1 to CLK4.

The first to fourth clocks CLK1 to CLK4 synchronize with the corresponding prior gate signals. Meanwhile, if a number of the prior gate lines GL1 does not correspond to a multiple of four, at least one of the second to fourth clocks CLK2 to CLK4 is disregarded. As an example, if the $(n+1)^{th}$ prior gate signal synchronizes with the second clock CLK2 in a frame period, the subsequent third and fourth clocks CLK3 and CLK4 are disregarded, and the first prior gate signal synchronizes with the first clock CLK1 in a next frame period.

The post gate signal is output by using the corresponding prior gate signal and the next prior gate signal. For example, the first post gate signal is output by using the first and second prior gate signals. In more detail, when the first prior gate signal has an "on" (negative) state, the first post gate signal has an "off" (positive) state during the first period. Then, when an "on" (negative) state of the first prior gate signal is finished and the second prior gate signal has an "on" (negative) state, the first post gate signal has an "on" (negative) state during the second period. In this manner, the first to $n^{th}$ post stages Po_SR1, Po_SR2, Po_SR3, Po_SR4, . . . , and Po_SRn sequentially output the post gate signals.

The second clock supply portion 640 outputs fifth to eighth clocks to the post shift register such that the post gate signals are normally output. The fifth, sixth, seventh and eighth clocks wave may accord with the second, third, fourth and first clocks, respectively. The fifth to eights clocks alternately are supplied to the post stages Po-SR1, Po_SR2, Po_SR3, Po_SR4, . . . , and Po_SRn and control the post gate signals such that the post gate signals have normal waveforms. Accordingly, the post gate signals are stably supplied without abnormality.

The first and second shift registers and the first and second clock supply portions include a plurality of TFT, which can be directly formed in the OELD device at the same processes as the switching and driving TFT. Accordingly, the post gate signal can be stably applied to the driving TFT during a long interval without a separate drive IC. In addition, the PMOS TFT are used as the switching and driving TFT and thus production cost can be reduced.

In the first and second embodiments, the four clocks are used for each of the prior and post shift registers. However, a number of clocks is not limited to four, and may be equal to greater than two.

In addition, in the first and second embodiments, the TFT of the shift register and the clock supply portion may be formed by the same processes of the switching and driving TFT. However, it should be understood that the TFT of the shift register and the clock supply portion may be formed outside or separately from the switching and driving TFT, such as in a drive IC.

The shift register and the clock supply portion has been explained with respect to a current-driving-type OELD device. However, the shift register and the clock supply portion can be applicable to other type of OELD device, such as a voltage driving type OELD device or a voltage compensation type OELD device.

Although the present invention has been explained by way of the examples described above, it should be understood to the ordinary skilled person in the art that the invention is not limited to the examples, but rather that various changes or modifications thereof are possible without departing from the spirit of the invention. Accordingly, the scope of the invention shall be determined only by the appended claims and their equivalents.

What is claimed is:

1. A method of driving an organic electroluminescent display device, comprising:

sequentially outputting from a prior shift register first and second prior gate signals to first and second pixels on first and second row lines, respectively, wherein:

the output of the first prior gate signals is triggered by a start of a first on-state of a first clock signal, and the output of the second prior gate signals is triggered by a start of a second on-state of a second clock signal, the second on-state is synchronized to start upon the completion of the first on-state, wherein the first on-state and the second on-state take place within a same period of a same clock cycle;

outputting from a post shift register a first post gate signal to the first pixel using the first and second prior gate signals, wherein the first post gate signal has an on-state when an on-state of the first prior gate signal is completed and the second prior gate signal has an on-state; and switching a switching device according to the first prior gate signal; and switching a driving device according to the first post gate signal, wherein the number of lines for prior gate signals is more than the number of lines for post gate signals;

wherein the first prior gate signal and the first post gate signal are applied to the same first row line, and on and off states of the first prior gate signal and the first post gate signal alternate.

2. The method according to claim 1, wherein the first prior gate signal is output using a previous prior gate signal and the first clock.

3. The method according to claim 2, wherein the first prior gate signal synchronizes with the first clock.

4. The method according to claim 3, wherein the second prior gate signal is output using the first prior gate signal and the second clock, the second prior gate signal synchronizing with the second clock.

5. The method according to claim 4, wherein the first post gate signal is output using a third clock, the third clock having the same waveform as the second clock.

6. The method according to claim 1, wherein the first post gate signal is output using a clock such that the first post gate signal is normally output.

7. The method according to claim 1, wherein the switching device includes first and second PMOS TFTs and the driving device includes third and fourth PMOS TFT, the third PMOS TFT connected to an organic electroluminescent diode.

8. The method according to claim 7, wherein switching the switching device includes turning on or off both the first and second PMOS TFT, and switching the driving device includes turning on or off the third PMOS TFT.

9. The method according to claim 8, further comprising storing a data signal to a storage capacitor according to switching the switching device, the storage capacitor connected to the fourth PMOS TFT.

10. An organic electroluminescent display device, comprises:

a prior shift register that comprises first and second prior gate lines connected to output first and second prior gate signals to first and second pixels on first and second row lines, respectively, wherein:

the output of the first prior gate signals is triggered by a start of a first on-state of a first clock signal, and the output of the second prior gate signals is triggered by a start of a second on-state of a second clock signal, the second on-state is synchronized to start upon the completion of the first on-state, wherein the first on-state and the second on-state take place within a same period of a same clock cycle;

a post shift register that comprises a first post gate line connected to the first pixel, the post shift register receiving the first and second prior gate signals of the first and second prior gate lines, and outputting a first post gate signal based on the first and second prior gate signals;

a switching device in the first pixel connected to the first prior gate line; and a driving device in the first pixel connected to the first post gate line, wherein the number of lines for the first and second prior gate signals is more than the number of lines for post gate signals; and wherein the first prior gate signal from the first prior gate line and the first post gate signal from the first post gate line are applied to the same first row line, and on and off states of the first prior gate signal and the first post gate signal alternate.

11. The device according to claim 10, wherein the first prior shift register stage is supplied with a gate signal of a previous prior shift register stage and the first clock.

12. The device according to claim 11, wherein the gate signal of the first prior shift register stage synchronizes with the first clock.

13. The device according to claim 12, wherein the second prior shift register stage is supplied with the gate signal of the first prior shift register stage and the second clock, the gate signal of the second prior shift register stage synchronizing with the second clock.

14. The device according to claim 13, wherein the first post shift register stage is supplied with a third clock, the third clock having the same waveform as the second clock.

15. The device according to claim 10, wherein the switching device includes first and second PMOS TFT and the driving device includes third and fourth PMOS TFT, the third PMOS TFT connected to an organic electroluminescent diode.

16. The device according to claim 15, further comprising a storage capacitor connected to the second PMOS TFT and the fourth PMOS TFT.

* * * * *